United States Patent
Park

(10) Patent No.: US 9,379,118 B2
(45) Date of Patent: Jun. 28, 2016

(54) METHODS OF FABRICATING SEMICONDUCTOR DEVICES INCLUDING INTERLAYER WIRING STRUCTURES

(71) Applicant: Samsung Electronics Co., Ltd., Suwon-si, Gyeonggi-do (KR)

(72) Inventor: Je-Min Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 104 days.

(21) Appl. No.: 14/303,142

(22) Filed: Jun. 12, 2014

(65) Prior Publication Data

US 2015/0132945 A1    May 14, 2015

(30) Foreign Application Priority Data

Nov. 13, 2013 (KR) .................. 10-2013-0137676

(51) Int. Cl.
*H01L 21/00*  (2006.01)
*H01L 27/108*  (2006.01)

(52) U.S. Cl.
CPC .... *H01L 27/10897* (2013.01); *H01L 27/10894* (2013.01)

(58) Field of Classification Search
CPC ............... H01L 27/10897; H01L 27/10894
See application file for complete search history.

(56) References Cited

U.S. PATENT DOCUMENTS

| 6,124,192 A * | 9/2000 | Jeng .................. H01L 21/76897 257/E21.507 |
| 7,645,700 B2 | 1/2010 | Standaert et al. |
| 7,842,600 B2 | 11/2010 | Yun et al. |
| 2012/0326313 A1 | 12/2012 | Uzoh et al. |

FOREIGN PATENT DOCUMENTS

| JP | 2012-119631 | 6/2012 |
| KR | 1020050062876 A | 6/2005 |
| KR | 1020050071060 A | 7/2005 |
| KR | 100711926 B1 | 4/2007 |
| KR | 1020070102007 A | 10/2007 |
| KR | 1020080059784 A | 7/2008 |
| KR | 1020080060360 A | 7/2008 |
| KR | 1020100003079 A | 1/2010 |

* cited by examiner

*Primary Examiner* — Richard Booth
(74) *Attorney, Agent, or Firm* — Myers Bigel & Sibley, P.A.

(57) ABSTRACT

Semiconductor devices and methods of fabricating the same are disclosed. The methods include forming a first interlayer insulating layer and a conductive contact plug that penetrates the first interlayer insulating layer, forming a second interlayer insulating layer and a first interlayer wiring on the first interlayer insulating layer. The first interlayer wiring penetrates the second interlayer insulating layer and overlaps the first metal contact plug. The second interlayer insulating layer is etched using the first interlayer wiring as a mask until the first metal contact plug is exposed, and an exposed portion of the conductive contact plug is etched using the first interlayer wiring as the mask.

20 Claims, 22 Drawing Sheets

METHODS OF FABRICATING SEMICONDUCTOR DEVICES INCLUDING INTERLAYER WIRING STRUCTURES

CROSS-REFERENCE TO RELATED APPLICATIONS

This application is based on and claims priority from Korean Patent Application No. 10-2013-0137676, filed on Nov. 13, 2013, in the Korean Intellectual Property Office, the disclosure of which is incorporated herein in its entirety by reference.

BACKGROUND

1. Field of the Invention

The present disclosure relates to semiconductor devices and methods of fabricating the same. In particular, the present disclosure relates to methods of forming interlayer wiring structures in semiconductor devices.

2. Description of the Related Art

Wiring structures are used to interconnect various devices formed on a semiconductor substrate. It is preferable that wiring structures for connecting various devices are not short-circuited to one another, and that the wiring structures themselves do not have any portions that are electrically open. As semiconductor devices become more highly integrated and more densely arranged, it has become more difficult to form wiring structures on a semiconductor substrate.

SUMMARY

In one aspect of the present inventive concept, there is provided a method for fabricating a semiconductor device comprising forming a first interlayer insulating layer and a conductive contact plug that penetrates the first interlayer insulating layer, forming a second interlayer insulating layer and a first interlayer wiring, which penetrates the second interlayer insulating layer and overlaps the conductive contact plug, on the conductive contact plug, etching the second interlayer insulating layer using the first interlayer wiring as a mask until the conductive contact plug is exposed, etching an exposed part of the conductive contact plug using the first interlayer wiring as the mask; and forming a third interlayer insulating layer that covers the first interlayer wiring.

In another aspect of the present inventive concept, there is provided a method for fabricating a semiconductor device comprising providing a substrate in which a cell array region and a peripheral region are defined, forming a memory device in the cell array region and forming an interlayer wiring in the peripheral region, wherein the forming the interlayer wiring includes forming a copper wiring that overlaps a conductive contact plug on the conductive contact plug, etching an exposed portion of the conductive contact plug using the copper wiring as a mask and forming an interlayer insulating layer on the copper wiring.

BRIEF DESCRIPTION OF THE DRAWINGS

The above and other objects, features and advantages of the present inventive concept will be more apparent from the following detailed description taken in conjunction with the accompanying drawings, in which.

DETAILED DESCRIPTION OF THE EMBODIMENTS

Figure 1:
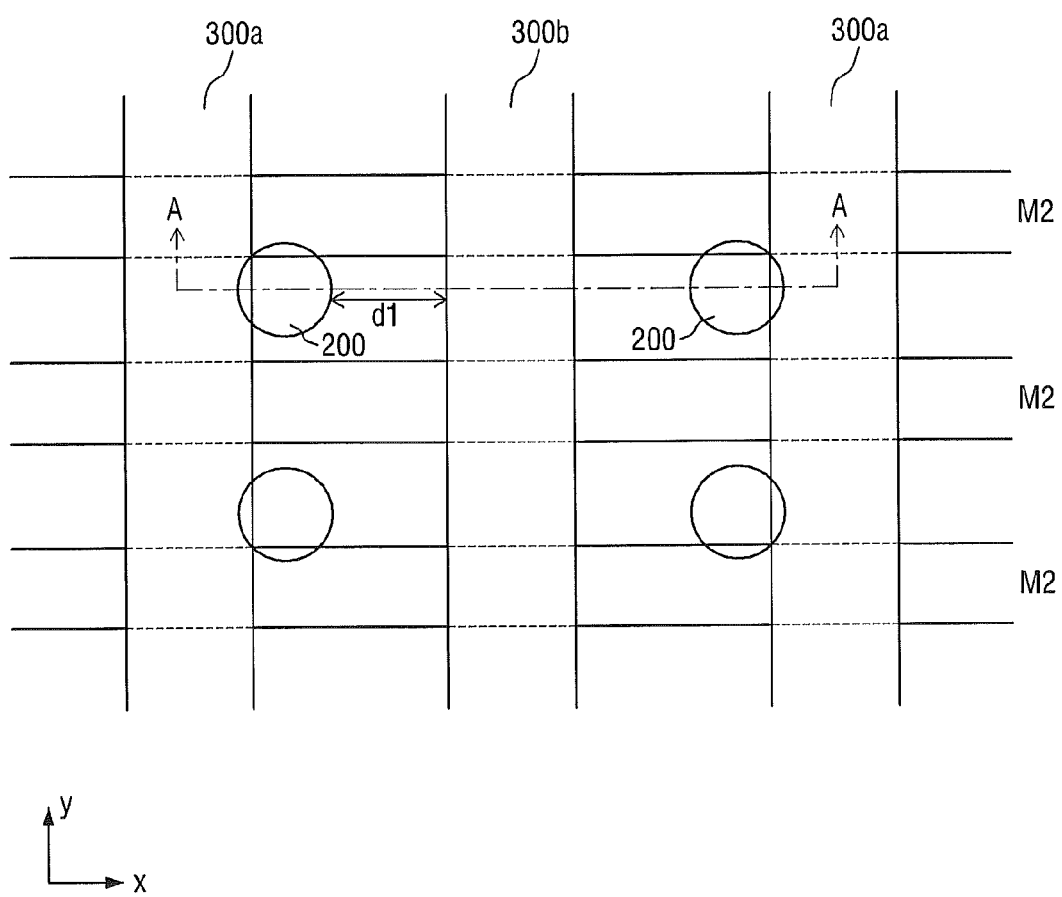
FIG. 1 is a plan view explaining a semiconductor device according to a first embodiment of the present invention.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the inventive concept to those skilled in the art, and the present inventive concept will only be defined by the appended claims. Like reference numerals refer to like elements throughout the specification.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to"

another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, a semiconductor device according to a first embodiment of the present inventive concept will be described with reference to FIGS. 1 and 2.

Figure 2:
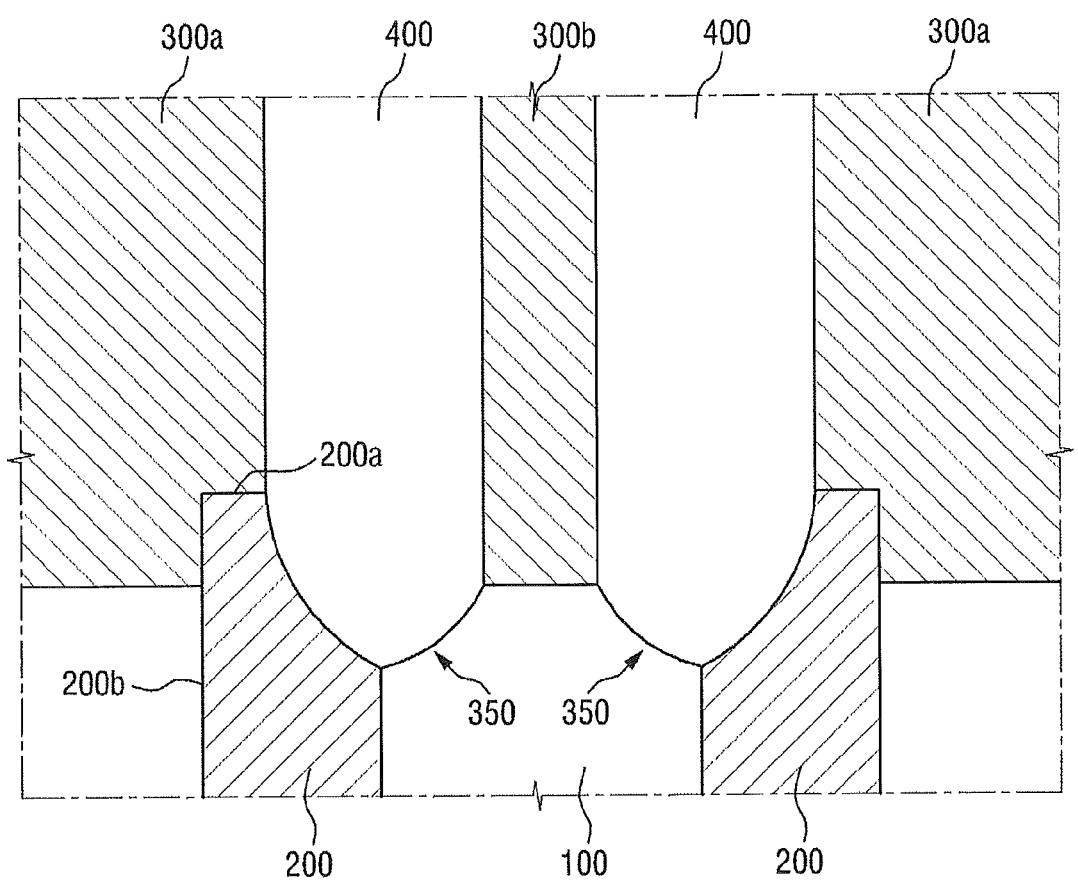
FIG. 2 is a cross-sectional view taken along line A-A of FIG. 1 explaining a semiconductor device according to a first embodiment of the present invention.

FIG. 1 is a plan view illustrating a semiconductor device according to a first embodiment of the present invention, and FIG. 2 is a cross-sectional view taken along line A-A of FIG. 1.

Referring to FIG. 2, a semiconductor device 1 according to a first embodiment of the present inventive concept includes a first interlayer insulating layer 100, a first metal contact plug 200 of which an upper portion is etched, a first interlayer wiring 300a, a second interlayer wiring 300b, a first trench 350, and a second interlayer insulating layer 400.

Specifically, the first interlayer insulating layer 100 may be formed on a semiconductor substrate. The first interlayer insulating layer 100 may provide electrical insulation between semiconductor devices positioned on a lower portion of the first interlayer insulating layer 100 and semiconductor devices positioned on an upper portion of the first interlayer insulating layer 100.

The first interlayer insulating layer 100 may be formed, for example, using silicon oxide, such as BSG (BoroSilicate Glass), PSG (PhosphoSilicate Glass), BPSG (BoroPhosphoSilicate Glass), USG (Undoped Silicate Glass), TEOS (TetraEthylOrtho Silicate Glass), or HDP-CVD (High Density Plasma-CVD).

Referring to FIG. 1, the first interlayer wiring 300a and the second interlayer wiring 300b may extend in parallel in the Y direction. M2 wiring may be formed on lower portions of the first interlayer wiring 300a and the second interlayer wiring 300b to extend in the X direction. The first interlayer wiring 300a and the second interlayer wiring 300b may not vertically overlap the M2 wiring.

The first metal contact plug 200, of which the upper portion is etched, may be formed to penetrate the first interlayer insulating layer 100. The first metal contact plug 200, of which an upper portion is etched, may be formed in a via-hole 150 that is vertically formed between the first interlayer wiring 300a and the M2 wiring. That is, an upper surface of the first metal contact plug 200, of which the upper portion is etched, may overlap the first interlayer wiring 300a, and a lower surface of the first metal contact plug 200, of which the upper portion is etched, may overlap the M2 wiring. The first metal contact plug 200, of which the upper portion is etched, may electrically connect the first interlayer wiring 300a and the M2 wiring to each other.

The first metal contact plug 200, of which the upper portion is etched, may include, for example, metal. Specifically, in this embodiment, the first metal contact plug 200, of which the upper portion is etched, may include, for example, tungsten, but the present inventive concept is not limited thereto.

The first interlayer wiring 300a may be formed on the first interlayer insulating layer 100. The first interlayer wiring 300a overlaps the first metal contact plug 200 of which the upper portion is etched. Specifically, the first interlayer wiring 300a may overlap not only an upper surface 200a of the first metal contact plug 200, of which the upper portion is etched, but also a side surface 200b thereof. The first interlayer wiring 300a may be electrically connected to the first metal contact plug 200 of which the upper portion is etched. The first interlayer wiring 300a may be a conductor. In this embodiment, the first interlayer wiring 300a may be, for example, a copper wiring. The copper wiring has higher electrical conductivity than existing aluminum, and can reduce the cost.

The second interlayer wiring 300b may be formed on the first interlayer insulating layer 100. The second interlayer wiring 300b may extend in the Y direction in parallel to the first interlayer wiring 300a. The second interlayer wiring 300b may not overlap the first metal contact plug 200 of which the upper portion is etched.

The second interlayer wiring 300b may be a conductor. The second interlayer to wiring 300b may be formed of the same material as the first interlayer wiring 300a. The second interlayer wiring 300b may be, for example, a copper wiring.

The first trench 350 may be formed on the first interlayer insulating layer 100 and the first metal contact plug 200 of which the upper portion is etched. The first trench 350 may have various shapes. For example, as illustrated, a side wall of the first trench 350 may be tilted at a predetermined angle. Further, a connection portion of a bottom surface and a side wall of the first trench 350 may have a rounded (concave) shape. The first trench 350 may have a flat bottom surface, but is not limited thereto.

The first interlayer wiring 300a and the second interlayer wiring 300b may be arranged on an upper portion of a side wall of the first trench 350. On the other hand, as illustrated, the first interlayer insulating layer 100 and the first metal contact plug 200, of which the upper portion is etched, may be arranged on a lower portion of the side wall and the bottom surface of the first trench 350.

The second interlayer insulating layer 400 may be formed in the first trench 350. Specifically, the second interlayer insulating layer 400 may be formed to fill the first trench 350. The second interlayer insulating layer 400 may be fully filled with an insulating material. The second interlayer insulating layer 400 may include, for example, at least one of silicon oxide, silicon nitride, and silicon oxynitride.

In this embodiment, the second interlayer wiring 300b and the first metal contact plug 200, of which the upper portion is etched, may be spaced apart from each other by the first trench as illustrated in the drawing. Accordingly, the second interlayer wiring 300b may not be electrically connected to the first metal contact plug 200 of which the upper portion is etched.

Specifically, the first interlayer wiring 300a and the second interlayer wiring 300b are wirings that connect different devices, and thus should not be connected to each other. Accordingly, if the first interlayer wiring 300a and the first metal contact plug 200 are connected to each other, the second interlayer wiring 300b should not be connected to the first metal contact plug 200. However, as the size of the semiconductor device 1 is reduced, the second interlayer wiring 300b may be closer to the first metal contact plug 200. Accordingly, if the first interlayer wiring 300a or the second interlayer wiring 300b is arranged in an undesired position it is possible that the second interlayer wiring 300b and the first metal contact plug 200 may inadvertently contact each other. However, by forming the first trench 350, the second interlayer wiring 300b and the first metal contact plug 200, can be separated from one another by a greater distance, which can reduce the chance of an unintentional connection. Accordingly, the semiconductor device 1 with improved reliability according to the first embodiment of the present inventive concept can be provided.

Figure 3:
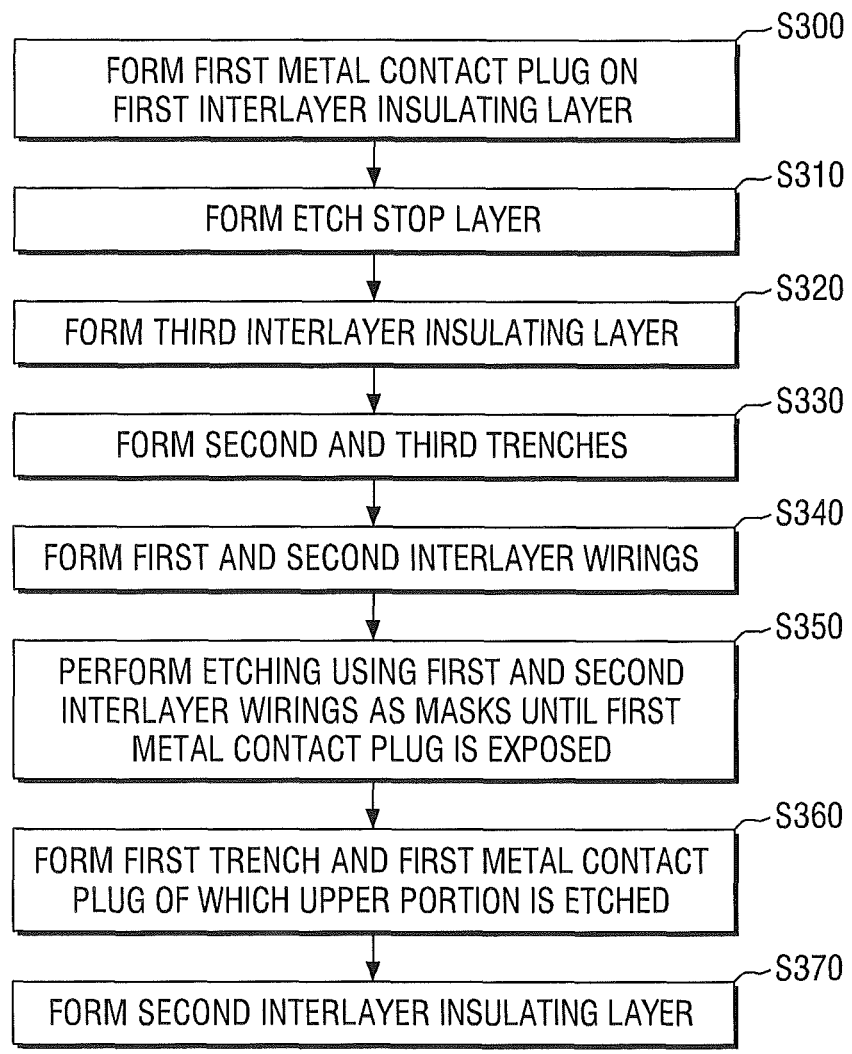
FIG. 3 is a flowchart illustrating a method for fabricating a semiconductor device according to a first embodiment of the present invention.

Referring to FIGS. 3 to 12, a method for fabricating a semiconductor device according to the first embodiment of the present inventive concept will be described. FIG. 3 is a flowchart illustrating a method for fabricating a semiconductor device according to a first embodiment of the present invention, and FIGS. 4 to 12 are views that illustrate intermediate steps of a method for fabricating a semiconductor device according to a first embodiment of the present invention.

Figure 4:
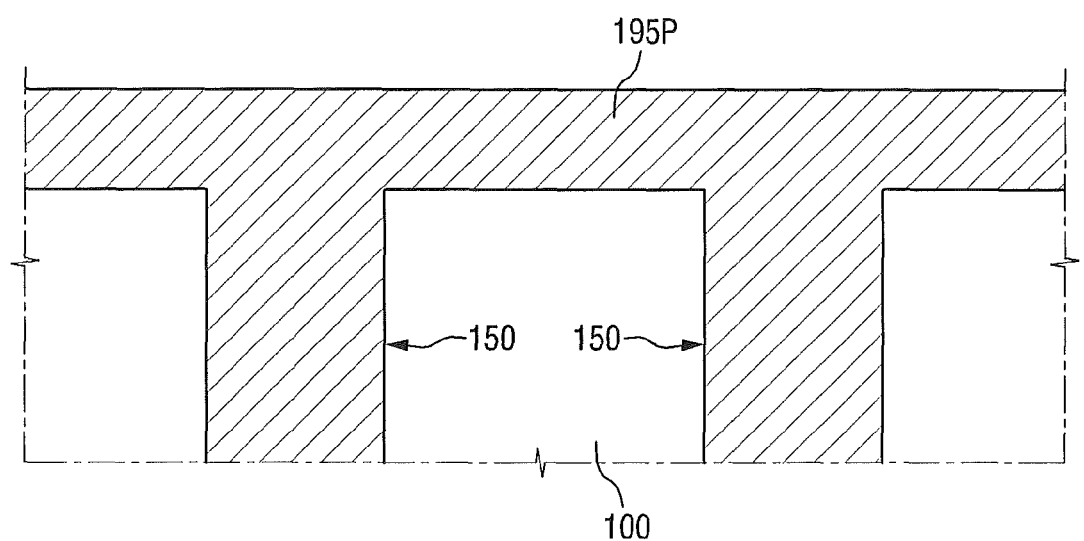
FIGS. 4 to 12 are views of intermediate steps explaining a method for fabricating a semiconductor device according to a first embodiment of the present invention.

Referring to FIGS. 3 and 4, a via-hole 150 that penetrates a first interlayer insulating layer and a metal contact layer that covers an upper surface of the first interlayer insulating layer are formed.

Specifically, referring to FIG. 4, a metal contact layer 195P may cover the first interlayer insulating layer 100. The metal contact layer 195P may fill a via-hole 150 that is formed to penetrate the first interlayer insulating layer 100. The metal contact layer 195P may include a conductive material, and may include, for example, at least one of poly silicon, metal silicide compound, conductive metal nitride, and metal, but is not limited thereto.

Referring again to FIG. 3, a dummy metal contact plug is formed on the first interlayer insulating layer (S300).

Figure 5:
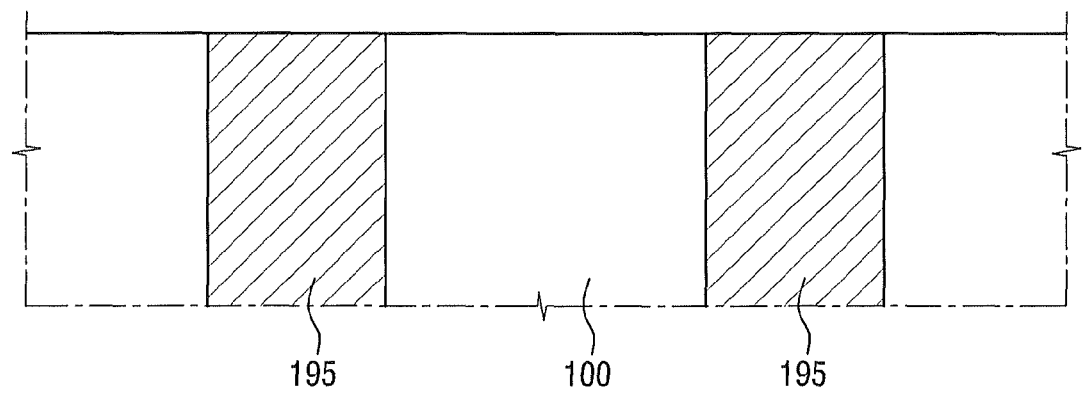

Specifically, referring to FIG. 5, a first metal contact plug 195, which is a first metal contact plug 200 of which the upper portion is etched, may be formed by etching the metal contact layer 195P until the first interlayer insulating layer 100 is exposed. An upper surface of the first metal contact plug 200 of which the upper portion is etched may be in the same plane as an upper surface of the first interlayer insulating layer. The "same plane" may mean inclusion of minute step height. The metal contact layer 195P may be etched using a CMP (Chemical Mechanical Polish) process.

Referring again to FIG. 3, an etch stop layer may be formed to cover the upper surface of the first interlayer insulating layer and the upper surface of the first metal contact plug of which the upper portion is etched (S310).

Figure 6:
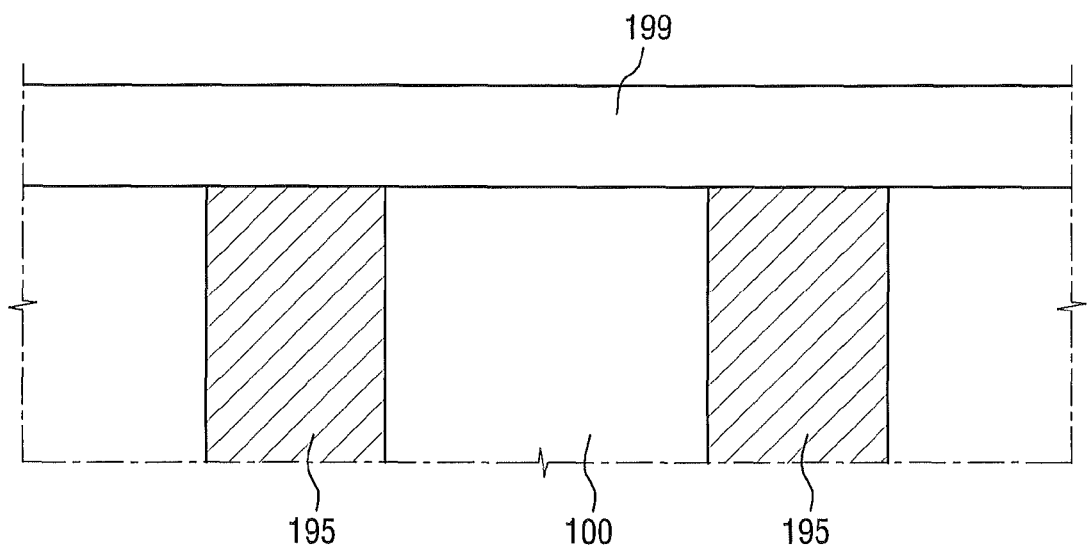

Specifically, referring to FIG. 6, the etch stop layer 199 may be formed on the first interlayer insulating layer 100. The etch stop layer 199 may facilitate the subsequent etching. Specifically, a material having inferior etch rate may be formed to facilitate setting of etch end point. In this embodiment, the etch stop layer 199 may include, for example, SiON or SiN. In some embodiments, the forming of the etch stop layer 199 may be omitted.

Referring again to FIG. 3, a third interlayer insulating layer may be formed on an upper surface of the etch stop layer (S320).

Figure 7:
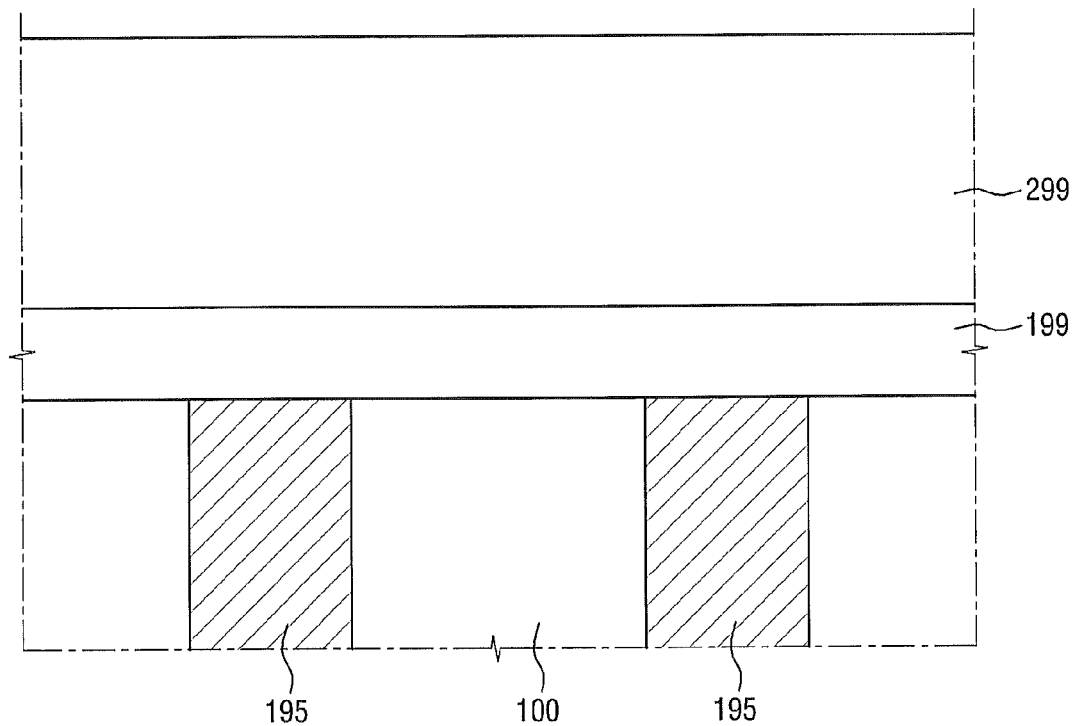

Specifically, referring to FIG. 7, the third interlayer insulating layer 299 may be formed on the etch stop layer 199. If the forming of the etch stop layer 199 is omitted, the third interlayer insulating layer 299 may be formed on the first interlayer insulating layer 100 and the first metal contact plug 195.

The third interlayer insulating layer 299 may be formed using silicon oxide, such as BSG (BoroSilicate Glass), PSG (PhosphoSilicate Glass), BPSG (BoroPhosphoSilicate Glass), USG (Undoped Silicate Glass), TEOS (TetraEthylOrthoSilicate Glass), or HDP-CVD (High Density Plasma-CVD).

Referring again to FIG. 3, a second trench and a third trench may be formed by etching the third interlayer insulating layer, the etch stop layer, and the first interlayer insulating layer until the first metal contact plug, of which a dummy upper portion is etched, is exposed (S330).

Figure 8:
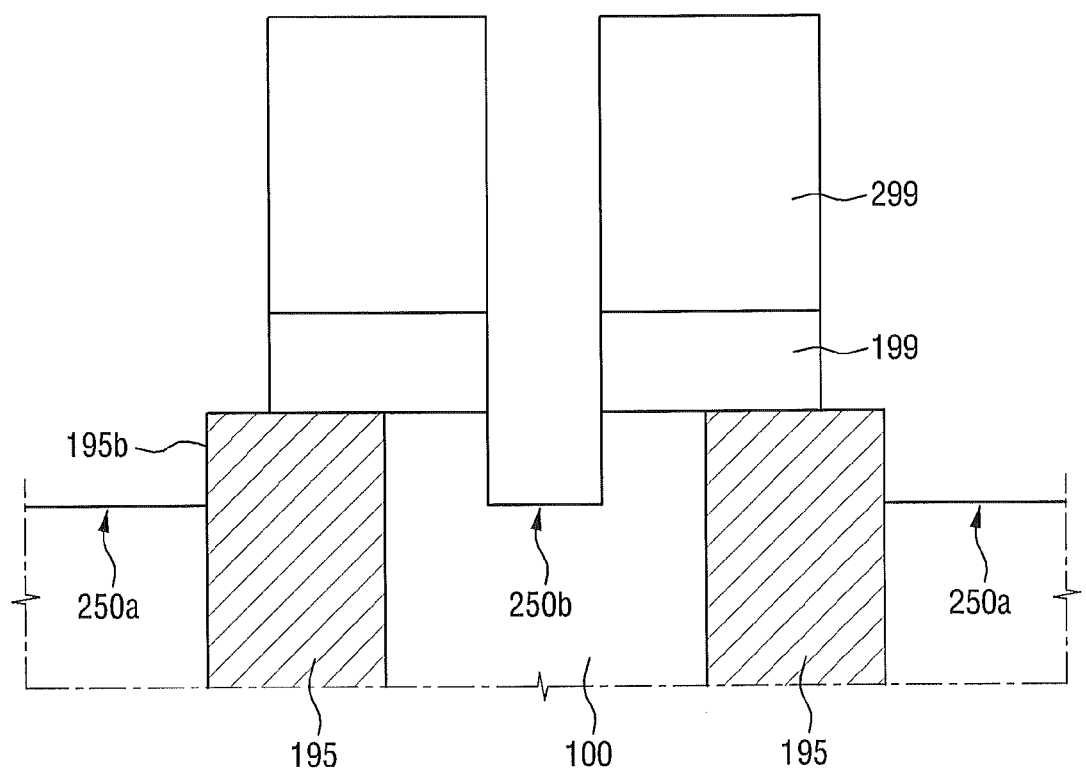

Specifically, referring to FIG. 8, the second trench 250a may expose the first metal contact plug 195. The third trench 250b may be formed between the first metal contact plugs 195 without exposing the first metal contact plug 195. Lower surfaces of the second trench 250a and the third trench 250b may be lower than the upper surface of the first metal contact plug 195.

As described above, the etch stop layer 199 may facilitate the etching. Specifically, without the etch stop layer 199, the etching time should be precisely adjusted. However, the etch stop film 199 is made of a material having relatively low etch rate, and can be maintained without being etched while a material having a relatively high etch rate is etched. Accordingly, if the etch stop layer 199 is subsequently removed, etching can be easily performed up to a desired portion.

An upper surface of the first metal contact plug 195 may be exposed. Further, as illustrated in FIG. 8, the first interlayer insulating film 100 is etched, and the side surface 195*b* of the first metal contact plug 195 may be exposed. Etching is performed until the first metal contact plug 195 is exposed, and parts of the first interlayer insulating layer 100 that does not overlap the first metal contact plug 195, the etch stop layer 199, and the third interlayer insulating layer 299 may be etched.

Referring again to FIG. 3, the first interlayer wiring may be formed in the second trench, and the second interlayer wiring may be formed in the third trench (S340).

Figure 9:
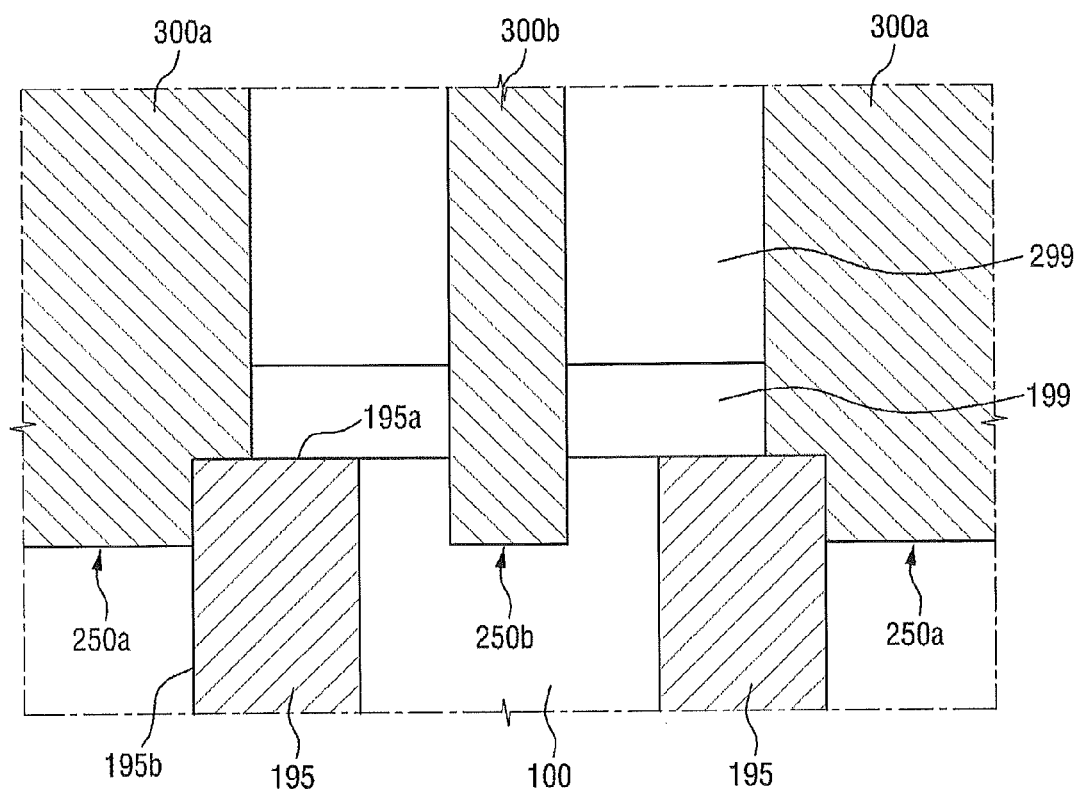

Specifically, referring to FIG. 9, the first interlayer wiring 300*a* may be formed in the second trench 250*a*. The second interlayer wiring 300*b* may be formed in the third trench 250*b*. The first interlayer wiring 300*a* may overlap the upper surface 195*a* of the first metal contact plug 195. In some embodiments, the first interlayer wiring 300*a* may overlap one of the side surfaces 195*b* of the first metal contact plug 195. The material of the first metal contact plug 195 may have an etch selectivity with respect to the material of the first and second interlayer wirings 300*a*, 300*b* for a wet etchant, such as chlorine. That is, the material of the first metal contact plug 195 may etch more quickly in chlorine than the material of the first and second interlayer wirings 300*a*.

The first interlayer wiring 300*a* and the second interlayer wiring 300*b* may include copper. Specifically, the first interlayer wiring 300*a* and the second interlayer wiring 300*b* may be formed through a copper damascene process.

Specifically, the copper damascene process will be described. First, through pre-cleaning, pollutants in the second trench 250*a* and the third trench 250*b* may be removed. The pollutants may include materials, such as native oxides, polymer, etc.

Then, a diffusion barrier layer may be formed. In this case, Ti, TiN, Ta, and/or TaN may be used as diffusion barrier layer materials.

Then, a copper seed layer may be formed. In this case, the copper seed layer may provide nucleation site for forming a bulk copper layer through electro-chemical plating.

Then, copper electro-chemical plating may be performed. The plating may be performed by generating copper ions in a copper electro-chemical plating solution through current.

Referring again to FIG. 3, the third interlayer insulating layer 299, the etch stop layer 199, and the first interlayer insulating layer 100 may be etched using the first interlayer wiring 300*a* and the second interlayer wiring 300*b* as etch masks until portions of the first metal contact plug are exposed (S350).

Figure 10:
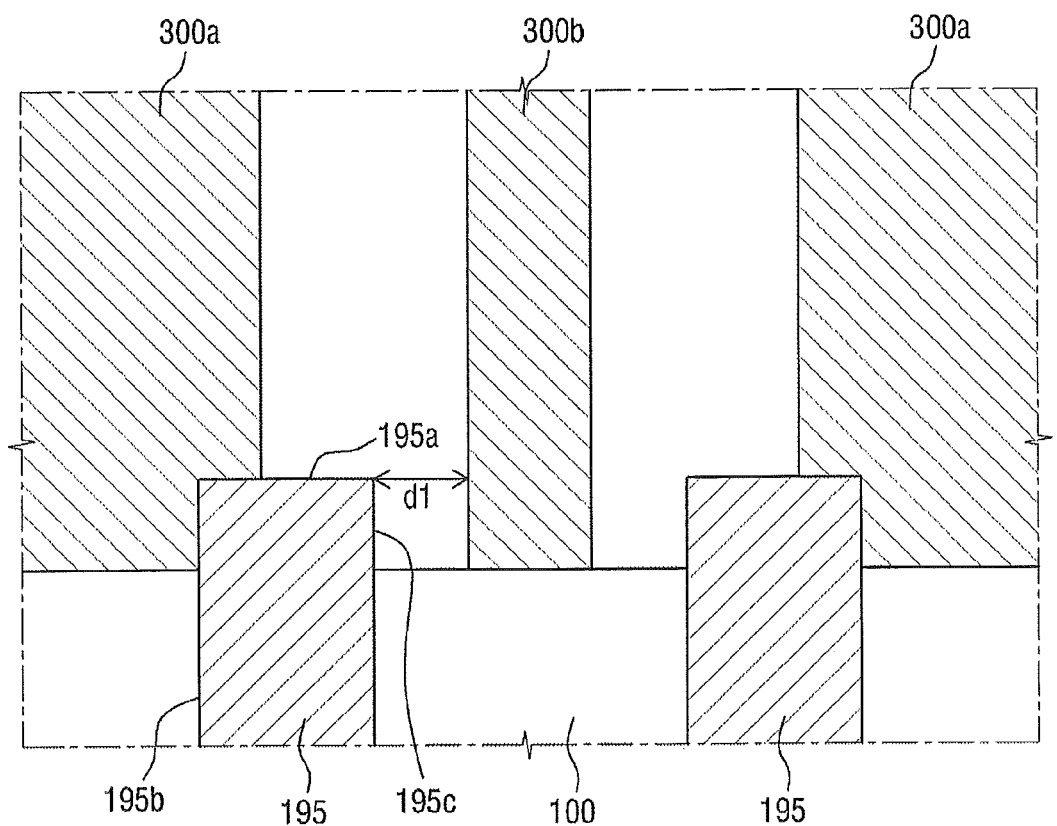

Specifically, referring to FIG. 10, if the first metal contact plug 195 is exposed, not only the third interlayer insulating layer 299 and the etch stop layer 199 but also the first interlayer insulating film 100 may be etched. If the first interlayer insulating film 100 is etched, the side surface 195*c* of the first metal contact plug 195 is also exposed, but is not limited thereto.

In this case, parts of the third interlayer insulating film 299 and the etch stop layer 199 may remain on the side surface of the first interlayer wiring 300*a*. That is, although it is general that the whole of the third interlayer insulating layer 299 and the etch stop layer 199 are etched, the present inventive concept is not limited thereto.

Referring again to FIG. 3, a first trench and a first metal contact plug, of which the upper surface is exposed, may be formed by etching the exposed first metal contact plug and the first interlayer insulating film (S360). In particular, an isotropic wet etch may be performed on the exposed first metal contact plug.

Figure 11:
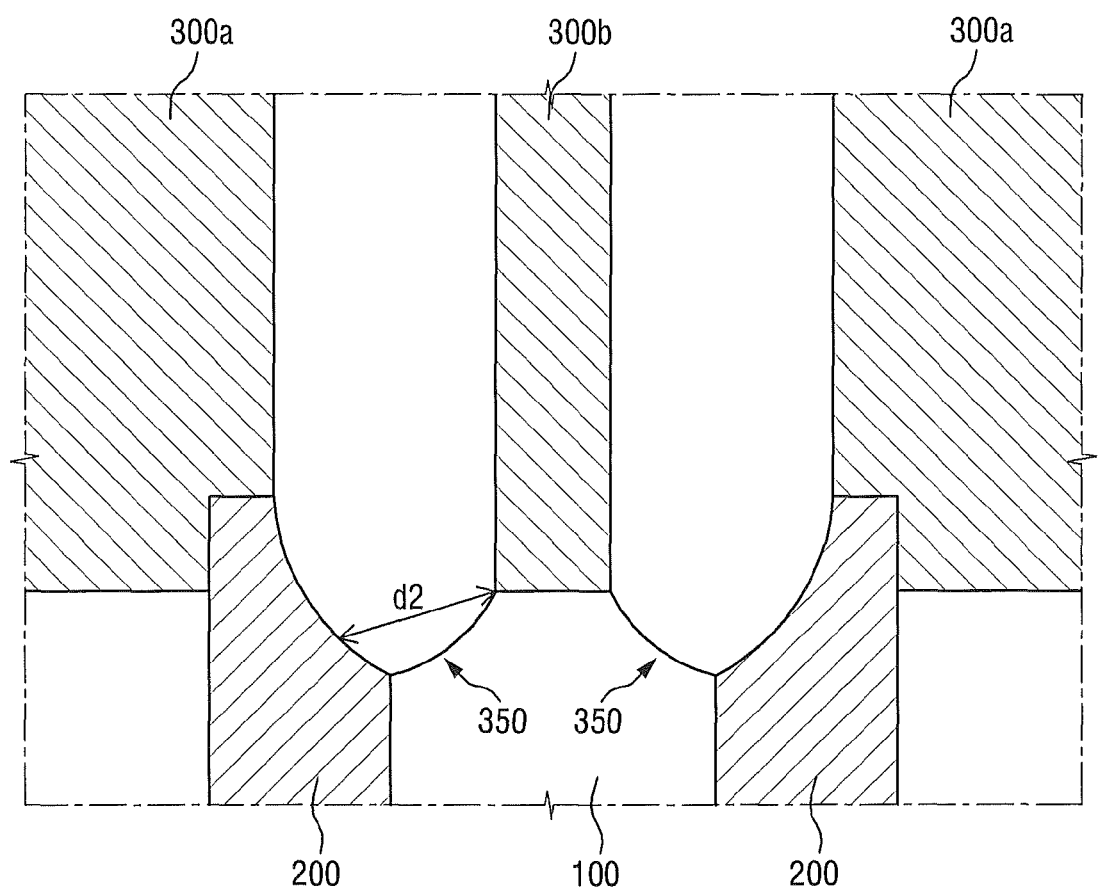

Specifically, referring to FIG. 11, the first trench 350 may be formed on the first interlayer insulating layer 100 and the first metal contact plug 200 of which the upper portion is etched. The first trench 350 may have various shapes. For example, as illustrated, a side wall of the first trench 350 may be tilted at a predetermined angle. Further, a connection portion of a bottom surface and a side wall of the first trench 350 may have a rounded shape, e.g. a convex shape as shown in FIG. 11. The first trench 350 may have a flat bottom surface, but is not limited thereto.

The first interlayer wiring 300*a* and the second interlayer wiring 300*b* may be arranged on an upper portion of a side wall of the first trench 350. On the other hand, as illustrated, the first interlayer insulating layer 100 and the first metal contact plug 200, of which the upper portion is etched, may be arranged on a lower portion of the side wall and the bottom surface of the first trench 350.

The first metal contact plug 200, of which the upper portion is etched, may be formed through etching of the first metal contact plug 195. The first metal contact plug 200, of which the upper portion is etched, may be spaced apart from the second interlayer wiring 300*b* by the first trench 350.

The first trench 350 may be formed by etching the first metal contact plug 195 using the first interlayer wiring 300*a* and the second interlayer wiring 300*b* as masks. The first metal contact plug 195 may be etched using wet etching. Specifically, the first metal contact plug 195 may be etched using chlorine (Cl) as an etching solution.

Referring again to FIG. 3, the second interlayer insulating layer may be formed to fill the first trench (S370).

Figure 12:
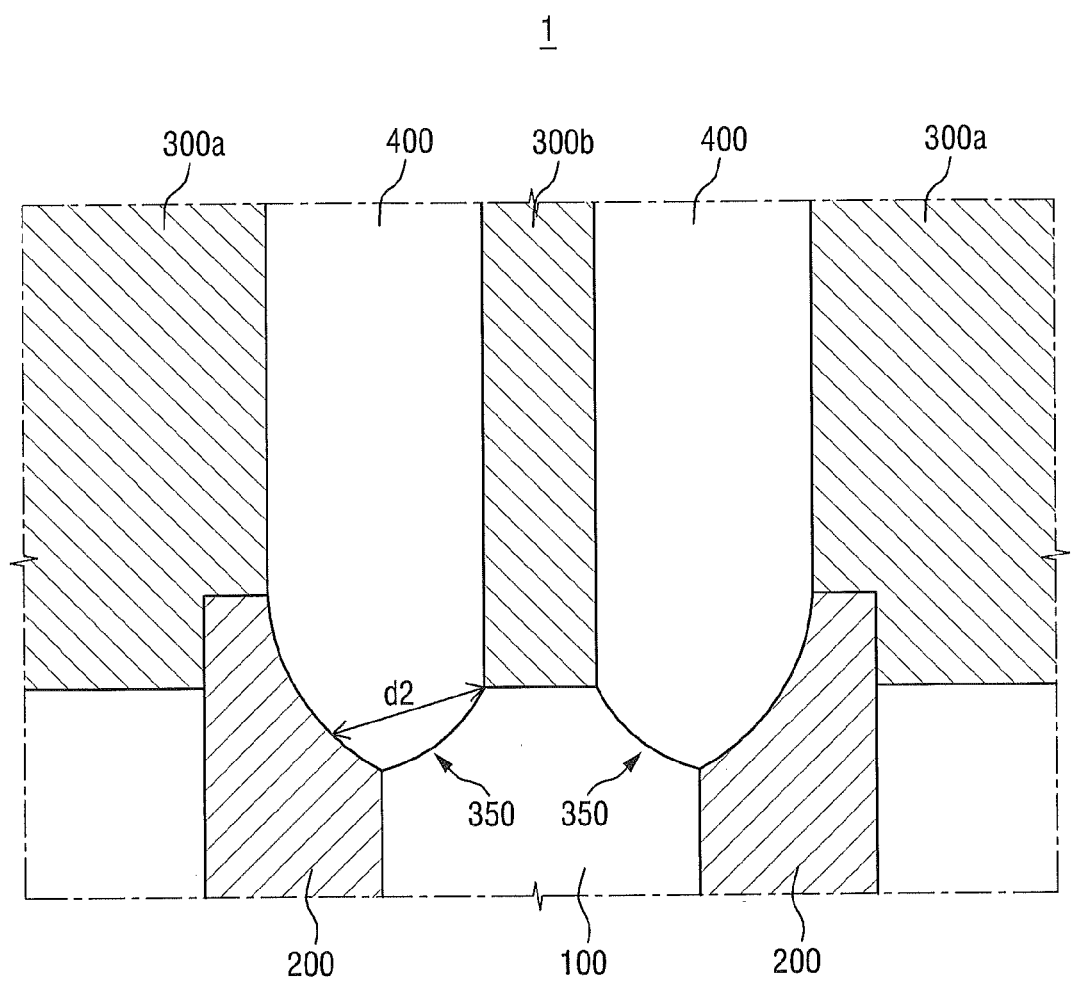

Specifically, referring to FIG. 12, the second interlayer insulating layer 400 may be fully filled with an insulating material. The second interlayer insulating layer 400 may include, for example, at least one of silicon oxide, silicon nitride, and silicon oxynitride.

Specifically, if the first trench 350 is formed, a distance d2 between the second interlayer wiring 300*b* and the first metal contact plug 200, of which the upper portion is etched, may be longer than a distance d1 between the second interlayer wiring 300*b* and the first metal contact plug 195 (FIG. 10). If the second interlayer wiring 300*b* is formed in an undesired place due to a cause in processing, d1 may become 0. That is, the second interlayer wiring 300*b* and the first metal contact plug 195 may be connected to each other. Even in this case, in the semiconductor device 1 according to the first embodiment of the present invention, the first trench 350 is formed, and thus the second interlayer wiring 300*b* and the first metal contact plug 200, of which the upper portion is etched, can be prevented from being unintentionally connected to each other.

Figure 13:
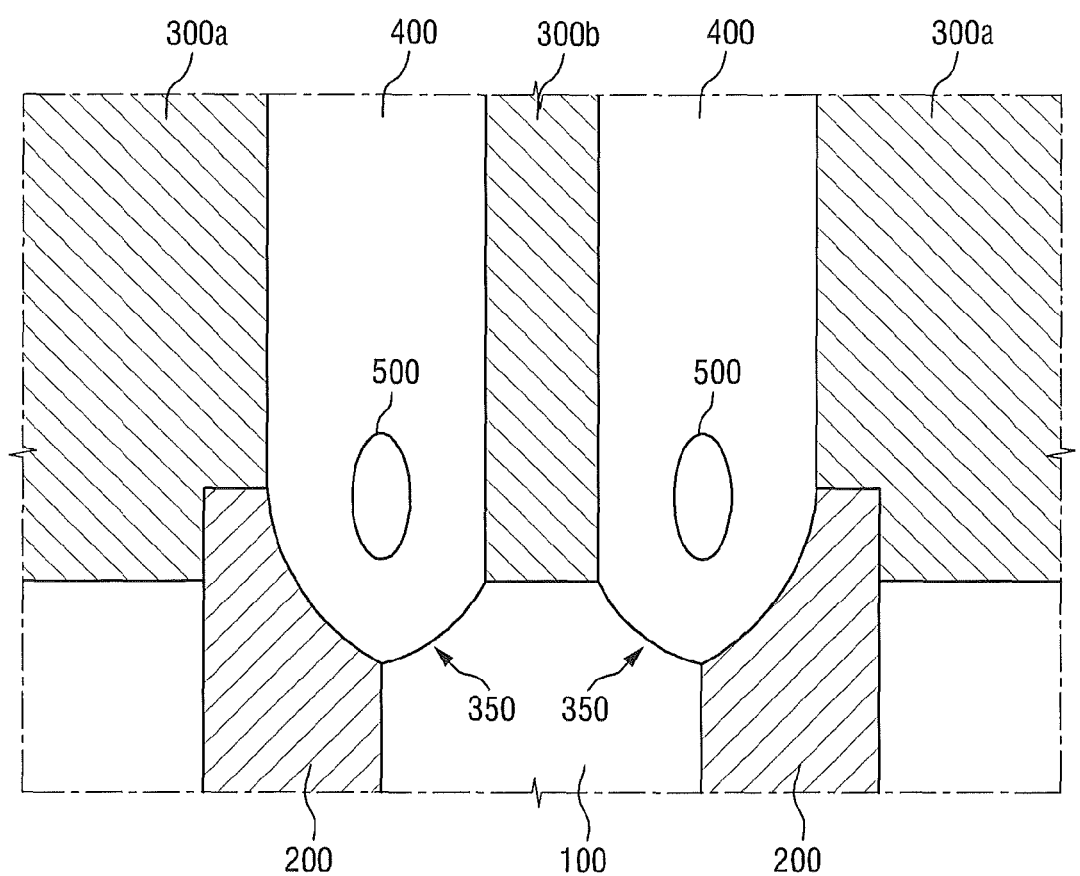
FIG. 13 is a cross-sectional view explaining a semiconductor device according to a second embodiment of the present invention.

Referring to FIG. 13, a semiconductor device and a method for fabricating a semiconductor device according to a second embodiment of the present inventive concept will be described.

FIG. 13 is a cross-sectional view explaining a semiconductor device according to a second embodiment of the present invention. Specifically, FIG. 13 shows a cross section taken along line A-A of FIG. 1. Since this embodiment is substantially the same as the first embodiment as described above except for an air gap 500, the same reference numerals are used for portions duplicate to those according to the first embodiment as described above, and the explanation thereof will be simplified or omitted.

Referring to FIG. 13, a semiconductor device 2 according to the second embodiment of the present inventive concept may further include an air gap 500.

The air gap 500 may be formed in the second interlayer insulating layer 400. Specifically, if the second interlayer insulating layer 400 is formed through a method having inferior step coverage, the air gap 500 may be produced. In this embodiment, for example, the second interlayer insulating layer 400 may be formed by CVD (Chemical Vapor Deposition) or PECVD (Plasma Enhanced Chemical Vapor Deposition).

The air gap 500 may serve to reduce parasitic capacitance between the second interlayer wiring 300b and the first metal contact plug 200 of which the upper portion is etched. Specifically, if a dielectric material exists between conductors, capacitance may exist. This capacitance has a very small value if the distance between the conductors is long, and thus may be disregarded. However, as the semiconductor device has recently become light, thin, short, and small, the distance between the conductors is reduced, and thus the capacitance is increased to cause a problem. This capacitance is called parasitic capacitance. If the parasitic capacitance becomes high, the operation of the semiconductor device 2 may become abnormal. This is because parallel capacitance is additionally generated in a desired circuit. If the air gap 500 is formed in the second interlayer insulating layer 400, the dielectric constant of the second interlayer insulating layer 400 is reduced, and thus the parasitic capacitance can be reduced. Accordingly, the semiconductor device 2 with improved reliability according to the second embodiment of the present inventive concept can be provided.

Figure 14A:
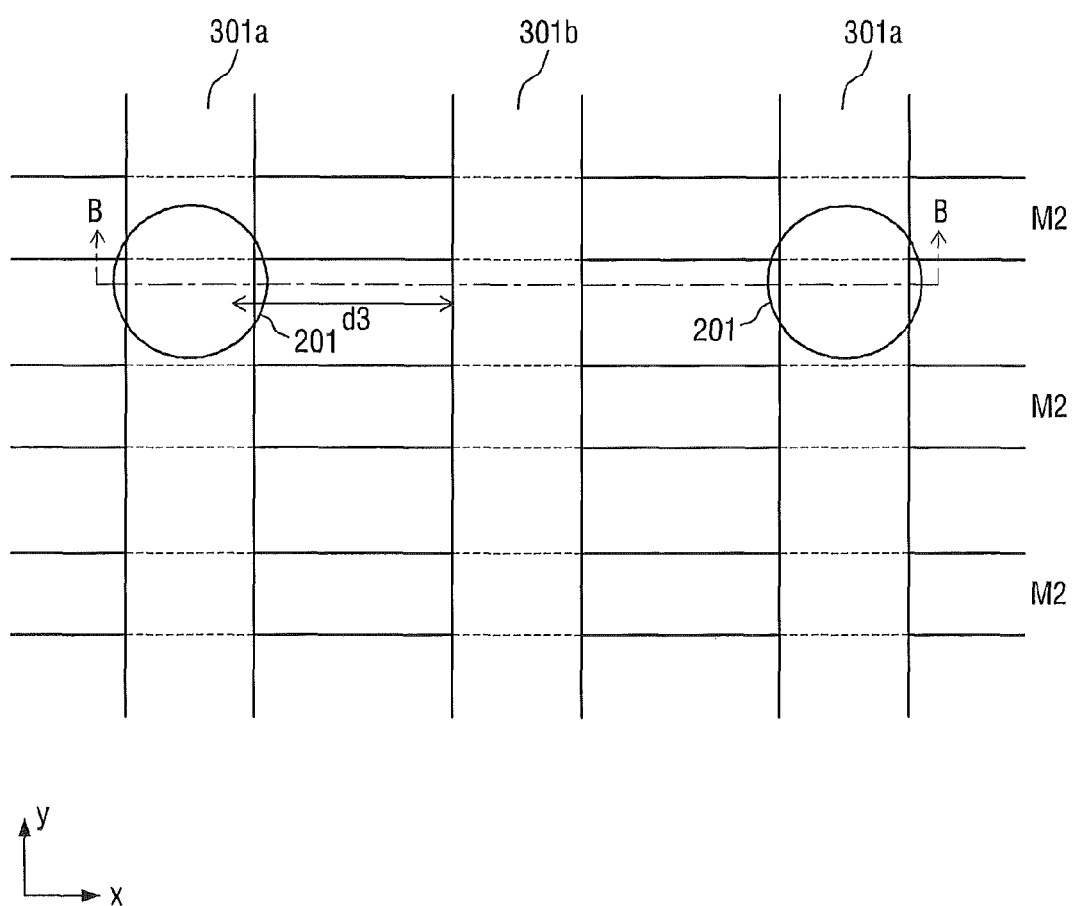
FIG. 14A is a plan view explaining a semiconductor device according to a third embodiment of the present invention.
Figure 14B:
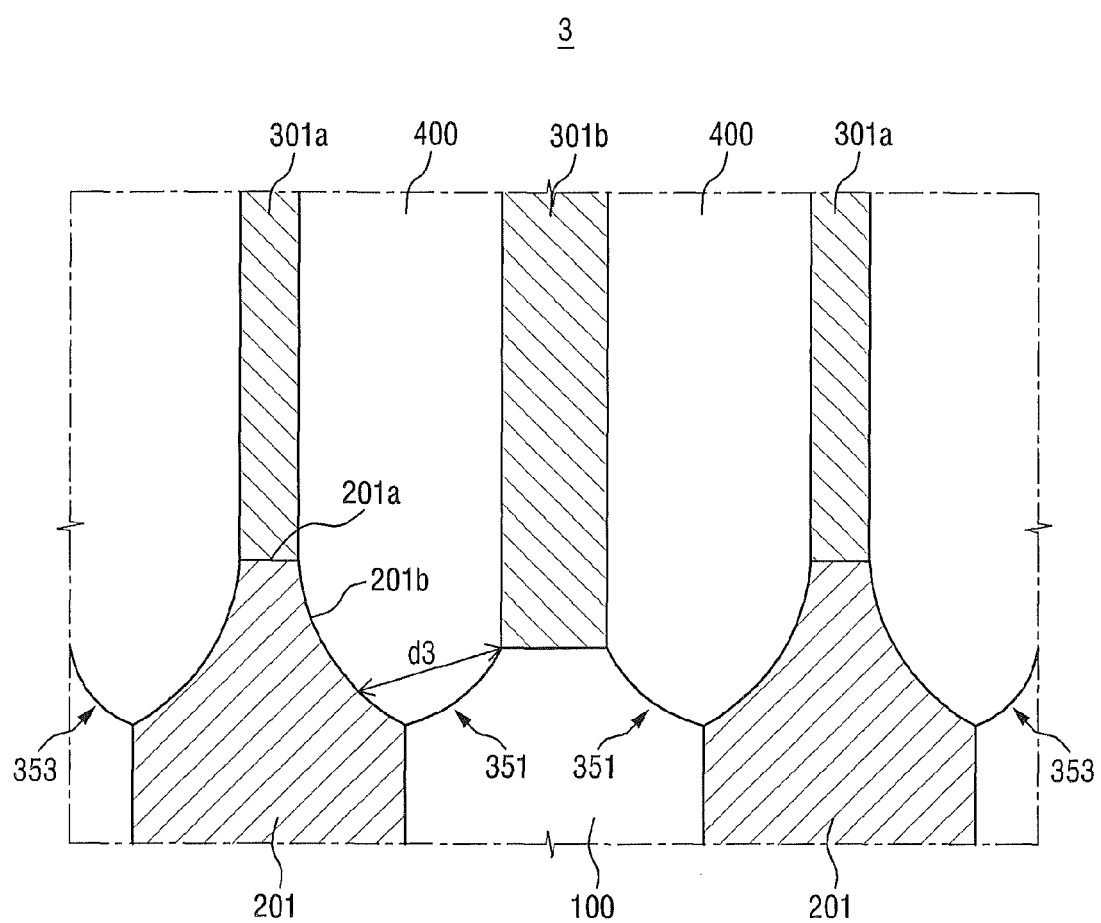
FIG. 14B is a cross-sectional view taken along line B-B of FIG. 14 explaining a semiconductor device according to a third embodiment of the present invention.

Referring to FIGS. 14A and 14B, a semiconductor device and a method for fabricating a semiconductor device according to a third embodiment of the present inventive concept will be described.

FIG. 14A is a plan view explaining a semiconductor device according to a third embodiment of the present invention, and FIG. 14B is a cross-sectional view taken along line B-B of FIG. 14 explaining a semiconductor device according to a third embodiment of the present invention. Since this embodiment is substantially the same as the first embodiment as described above except for an arrangement structure of a first interlayer wiring 300a and a second metal contact plug 201, the same reference numerals are used for portions duplicate to those according to the first embodiment as described above, and the explanation thereof will be simplified or omitted.

Referring to FIG. 14A, a third interlayer wiring 301a and a fourth interlayer wiring 301b may extend in parallel in the Y direction. M2 wiring may be formed on lower portions of the third interlayer wiring 301a and the fourth interlayer wiring 301b to extend in the X direction. The third interlayer wiring 301a and the fourth interlayer wiring 301b may not vertically overlap the M2 wiring.

Referring to FIG. 14B, a semiconductor device 3 according to a third embodiment of the present inventive concept may further include the second metal contact plug 201, the third interlayer wiring 301a, the fourth interlayer wiring 301b, a fourth trench 351, and a fifth trench 353.

Both sides of the second metal contact plug 201 may be etched. That is, the second metal contact plug 201 may have a shape that is cut by the fourth trench 351 and the fifth trench 353. An upper surface 201a of the second metal contact plug 201 may overlap the third interlayer wiring 301a. However, a side surface 201b of the second metal contact plug 201 may not overlap the third interlayer wiring 301a.

The third interlayer wiring 301a may overlap only the upper surface of the second metal contact plug 201. Referring to FIG. 14a, specifically, the third interlayer wiring 301a may be accurately aligned on the upper surface of the second metal contact plug 201. In this case, the third interlayer wiring 301a may not be formed on the side surface 201b of the second metal contact plug 201.

The third interlayer wiring 301a may be electrically connected to the second metal contact plug 201. The third interlayer wiring 301a may be a conductor. In this embodiment, the third interlayer wiring may be, for example, copper wiring.

The fourth interlayer wiring 301b may not overlap the second metal contact plug 201. The fourth interlayer wiring 301b may be a conductor. That is, the fourth interlayer wiring 301b may be formed of the same material as the first interlayer wiring 300a. In this embodiment, the fourth interlayer wiring 301b may be, for example, copper wiring.

The fourth trench 351 may be formed on the first interlayer insulating layer 100 and the second metal contact plug 201. The fourth trench 351 may have a similar shape to the first trench 350.

The third interlayer wiring 301a and the fourth interlayer wiring 301b may be arranged on an upper portion of a side wall of the fourth trench 351. On the other hand, as illustrated, the first interlayer insulating layer 100 and the second metal contact plug 201 may be arranged on a lower portion of a side wall and a bottom surface of the fourth trench 351.

The fifth trench 353 may be formed on the first interlayer insulating layer 100 and the second metal contact plug 201. The fifth trench 353 may be formed in a position that corresponds to the fourth trench 351 around the second metal contact plug 201. The fifth trench 353 may have a similar shape to the fourth trench 351.

If the fourth trench 351 and the fifth trench 353 are formed, a distance d3 between the fourth interlayer wiring 301b and the second metal contact plug 201 may be longer than a distance between the fourth interlayer wiring 301b and the first metal contact plug 195. If the fourth interlayer wiring 301b is formed in an undesired place (e.g., due to variations in processing), the fourth interlayer wiring 301b and the first metal contact plug 195 may be connected to each other. Even in this case, in the semiconductor device 3 according to the third embodiment of the present invention, the fourth trench 351 is formed, and thus the fourth interlayer wiring 301b and the second metal contact plug 201, of which the upper portion is etched, can be prevented from being connected to each other.

Figure 15:
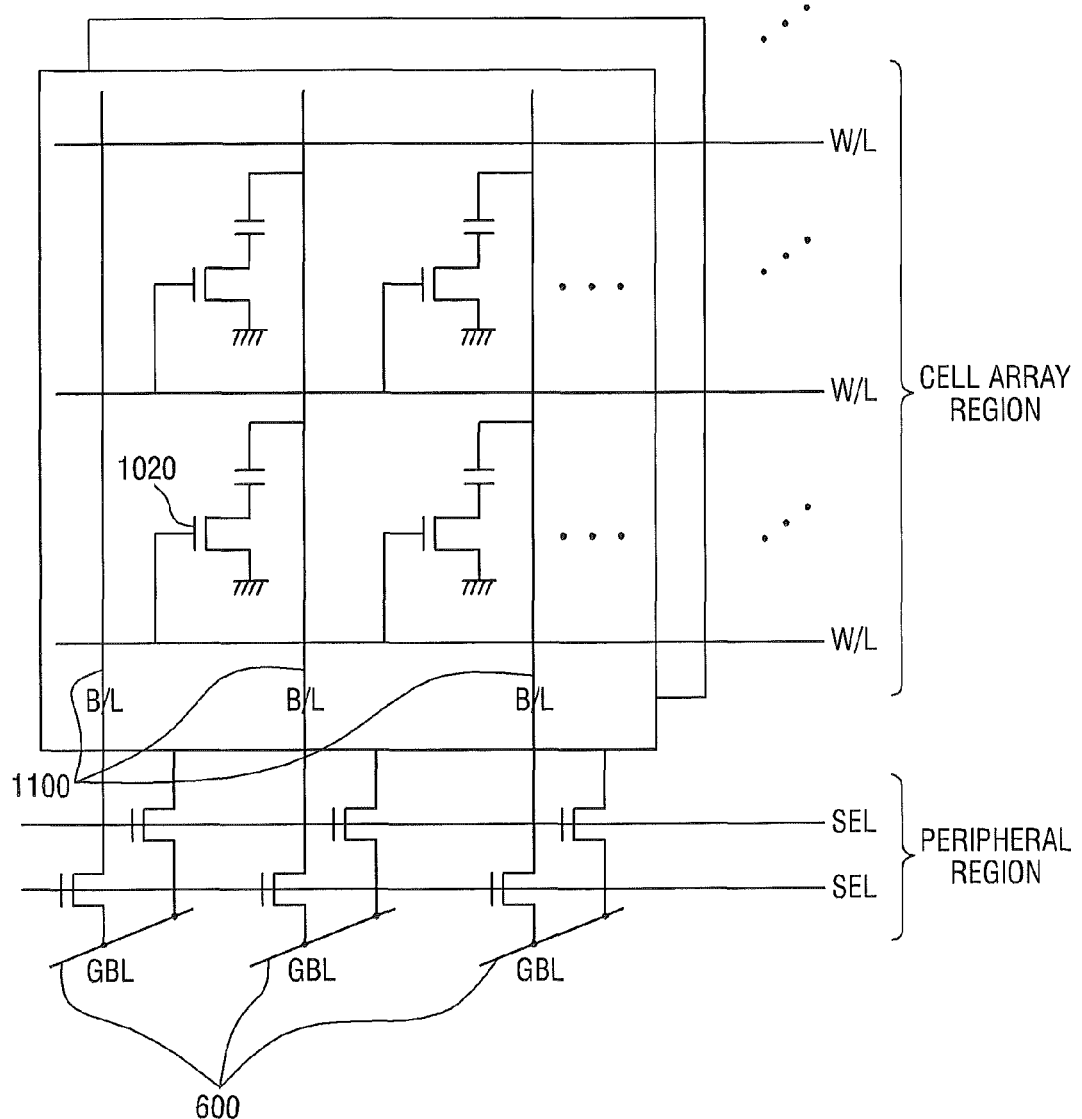
FIG. 15 is a circuit diagram explaining a semiconductor device according to a fourth embodiment of the present invention.
Figure 16:
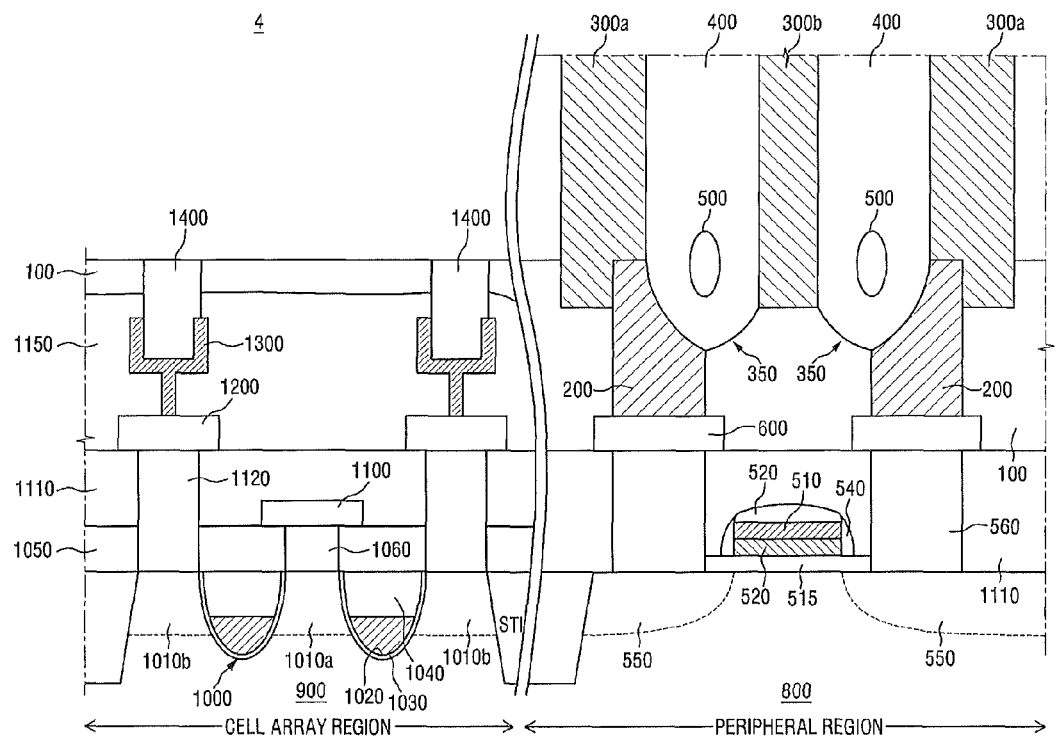
FIG. 16 is a cross-section view explaining a semiconductor device according to a fourth embodiment of the present invention.

Referring to FIGS. 15 and 16, a semiconductor device according to a fourth embodiment of the present inventive concept will be described.

FIG. 15 is a circuit diagram explaining a semiconductor device according to a fourth embodiment of the present invention, and FIG. 16 is a cross-section view explaining a semiconductor device according to a fourth embodiment of the present invention.

Referring to FIG. 15, a semiconductor device 4 according to a fourth embodiment of the present inventive concept may be a memory device. For example, the memory device 4 may be a DRAM (Dynamic Random Access Memory). The DRAM may be divided into a cell array region where memory devices are aligned, and a core and peripheral region (hereinafter referred to as a "peripheral region").

In a cell array region, cells composed of transistors including gate electrodes 1020 may be gathered as a 3D structure. A word line that continues in the Y direction of respective rows and a first bit line 1100 that continues in the X direction of respective columns may be shared by one cell plane. A plurality of cell planes may be provided. That is, several cell planes may be stacked in the Z direction.

In the peripheral region, addresses of the respective cells may be selected using a select signal for selecting the first bit line 1100. The second bit line 600 may be electrically connected to the first bit line 1100 of the respective cell planes. The second bit line 600 may extend in the Z direction. In this embodiment, for example, the first bit line 110 may be a local bit line, and the second bit line 600 may be a global bit line.

Referring to FIG. 16, a semiconductor device 4 according to the fourth embodiment of the present inventive concept further includes the gate electrode 1020, the first bit line 1100, a landing pad 1200, a capacitor 1300, a storage contact 1400, and the second bit line 600.

Specifically, a STI (Shallow Trench Isolation) layer that divides the cell array region and the peripheral region may be formed on the substrate.

In the cell array region, a BCAT (Buried Channel Array Transistor) may be formed, but is not limited thereto. Specifically, a plurality of gate trenches 1000 may be formed in a first active region 900, and gate insulating layers 103 may be formed in order. The gate trench 1000 may be buried by the gate electrode 1020 and a capping pattern 1040. A first source/drain region 1010*a* and a second source/drain region 1010*b* may be formed on the side surface of the gate trench 1000. The first source/drain region 1010*a* may be formed between two gate trenches 1000. The second source/drain region 1010*b* may be formed between the STI layer and the gate trench 1000.

A fourth interlayer insulating layer 1050 may be formed on the gate trench 1000, the first source/drain region 1010*a*, and the second source/drain 1010*b*, and a first bit line contact 1060 that penetrates the fourth interlayer insulating layer 1050 may be formed. The first bit line that is electrically connected to the first bit line contact 1060 may be formed on the first bit line contact 1060.

A fifth interlayer insulating layer 1110 may be formed on the fourth interlayer insulating layer 1050. The contact plug 1120 may be formed to penetrate the fourth interlayer insulating layer 1050 and the fifth interlayer insulation layer 1060. The landing pad 1200 may be formed on the contact plug 1120 to be electrically connected to the contact plug 1120.

The capacitor 1300 may be formed on the landing pad 1200 to be electrically connected to the landing pad 1200. A sixth interlayer insulating layer 1150 may be formed to cover the capacitor 1300. The first interlayer insulating layer 100 may be formed on the sixth interlayer insulating layer 1150. The first interlayer insulating layer 1150 may be formed on the sixth interlayer insulating layer 1150. The storage contact 1400 may be formed to penetrate the first interlayer insulating layer 100 and the sixth interlayer insulating layer 1150. The storage contact 1400 may be electrically connected to the capacitor 1300.

In the peripheral region, a gate pattern may be formed. A gate oxide layer 515, a first conductive layer 520, a second conductive layer 510, and an insulating layer 530 may be sequentially formed on a second active region 800, and a gate spacer 540 may be formed on a side surface of the gate pattern.

A third source/drain region 550 may be formed on a side surface of the gate pattern in the second active region 800. The fifth interlayer insulating layer 1110 may be formed to cover the gate pattern and the third source/drain region 550. The second bit line 600 may be formed on a second bit line contact 560 to be electrically connected to the second bit line contact 560.

The first interlayer insulating layer 100 may be formed to cover the second bit line 600 and the fifth interlayer insulating layer 1110. The first metal contact plug 200, of which the upper portion is etched, may be formed to penetrate the first interlayer insulating layer. The first interlayer wiring 300*a* may be formed to overlap the first metal contact plug 200, of which the upper portion is etched, and the second interlayer wiring 300*b* may be formed not to overlap the first metal contact plug 200 of which the upper portion is etched. The first trench 350 may be formed on the first metal contact plug 200, of which the upper portion is etched, and the first interlayer insulating layer 100. The third interlayer insulating layer 299 may be formed to bury the first trench 350. The air gap 500 may be formed in the third interlayer insulating layer 299.

Then, referring to FIGS. 17 to 21, a method for fabricating a semiconductor device according to a fourth embodiment of the present inventive concept will be described.

FIGS. 17 to 21 are views of intermediate steps explaining a method for fabricating a semiconductor device according to a fourth embodiment of the present invention.

Figure 17:
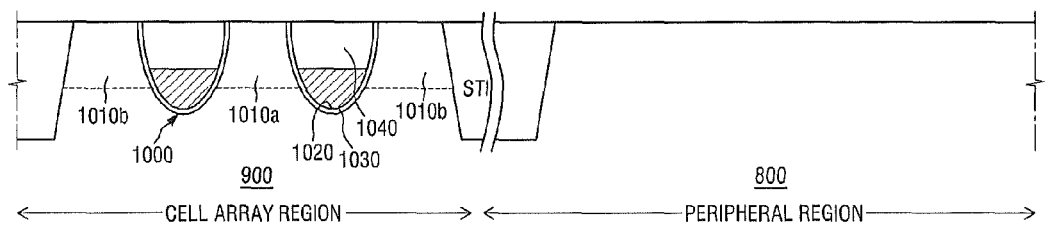
FIGS. 17 to 21 are views of intermediate steps explaining a method for fabricating a semiconductor device according to a fourth embodiment of the present invention.

Referring to FIG. 17, a transistor is formed in a cell array region. The transistor may be BCAT (Buried Channel Array Transistor), but is not limited thereto. Here, it is exemplified that the transistor is the BCAT.

A semiconductor substrate may be divided into a cell array region and a peripheral region by a STI layer. A plurality of gate trenches 1000 may be formed in a first active region 900, and a gate insulating layer 1030, a gate electrode 1020, and a capping pattern 1040 may be sequentially formed. A first source/drain region 1010*a* may be formed between two gate trenches 1000, and a second source/drain region 1010*b* may be formed between the STI layer and the gate trench 1000.

Figure 18:
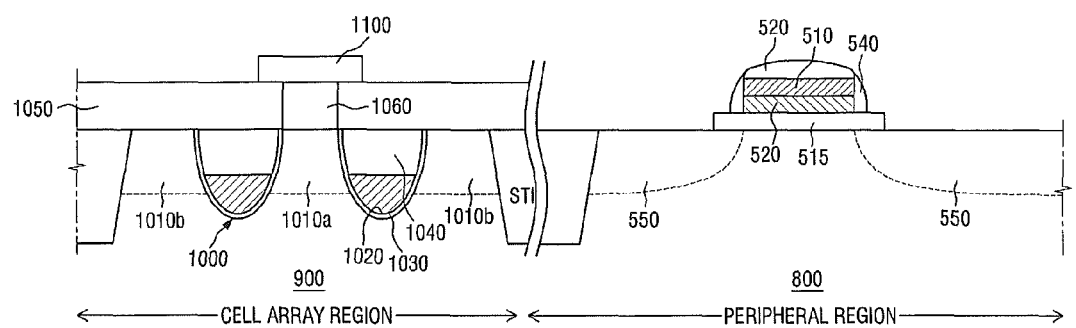

Referring to FIG. 18, a first bit line 1100 of the cell array region and a gate pattern of the peripheral region may be simultaneously formed.

In the cell array region, a fourth interlayer insulating layer 1050 may be formed on the gate trench 1000, the first source/drain region 1010*a*, and the second source/drain 1010*b*. A first bit line contact 1060 may be formed to penetrate the fourth interlayer insulating layer 1050. The first bit line contact 1060 may be electrically connected to the first source/drain region 1010*a*. A first bit line 1100 may be formed on the first bit line contact 1060 and may be electrically connected to the first bit line contact 1060.

In the peripheral region, a gate pattern may be formed. A gate oxide layer 515, a first conductive layer 520, a second conductive layer 510, and an insulating layer 530 may be sequentially formed on a second active region 800, and then a gate spacer 540 may be formed on a side surface of the gate pattern. A third source/drain region 550 may be formed on a side surface of the gate pattern in the second active region 800.

In this case, the first bit line 1100 of the cell array region and the gate pattern of the peripheral region may be simultaneously formed.

Figure 19:
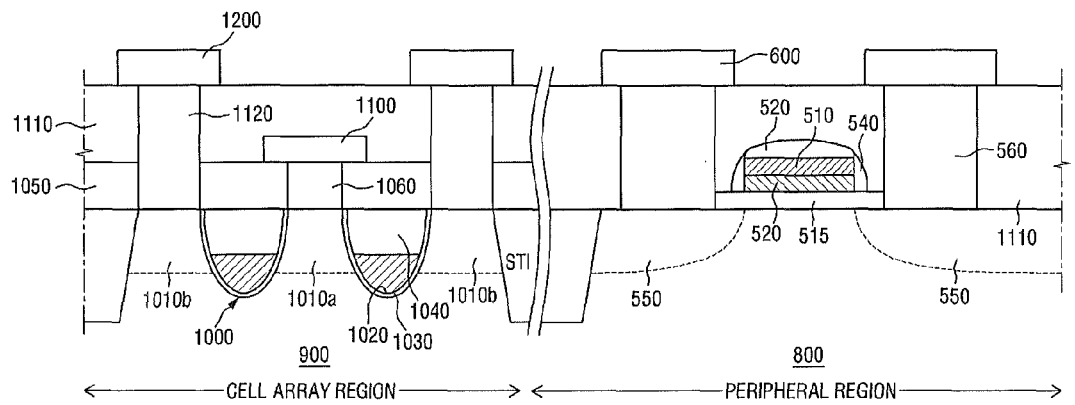

Referring to FIG. 19, a fifth interlayer insulating layer 1110 may be formed on the first bit line 1100 and the fourth interlayer insulating layer 1050 of the cell array region, and may be formed on the gate pattern and the third source/drain region 550 of the peripheral region.

In the cell array region, a contact plug 1120 may be formed to penetrate the fifth interlayer insulating layer 1110 and the fourth interlayer insulating layer 1050. A landing pad 1200 may be formed on the contact plug 1120 and may be electrically connected to the contact plug 1120.

In the peripheral region, a second bit line contact 560 may be formed to penetrate the fifth interlayer insulating layer 1110. A second bit line 600 may be formed on the second bit line contact 560 and may be electrically connected to the second bit line contact 560.

Here, the landing pad 1200 of the cell array region and a second bit line 600 of the peripheral region may be simultaneously formed.

Figure 20:
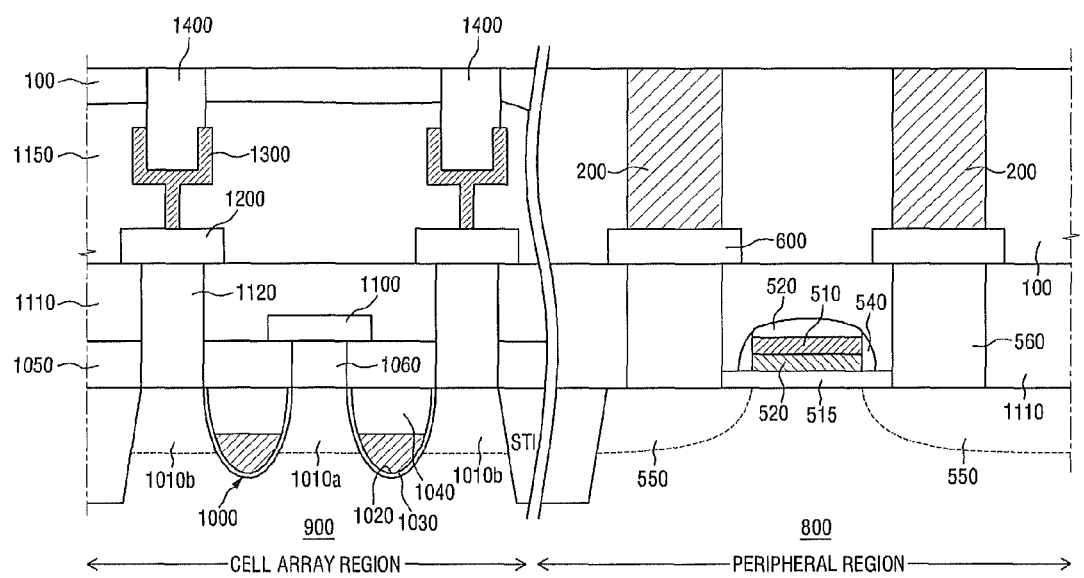

Referring to FIG. 20, a storage contact 1400 of the cell array region and a first metal contact plug 200, of which the upper portion is etched, of the peripheral region may be simultaneously formed.

In the cell array region, a capacitor 1300 may be formed on the landing pad 1200 and may be electrically connected to the landing pad 1200. A sixth interlayer insulating layer 1150 may be formed to cover the capacitor 1300. A first interlayer insulating layer 100 may be formed on the sixth interlayer insulating layer 1150 of the cell array region, the second bit line 600 of the peripheral region, and the fifth interlayer insulating layer 1110.

In the cell array region, the storage contact 1400 may be formed to penetrate the sixth interlayer insulating layer 1150 and the first interlayer insulating layer 100. In the peripheral region, the first metal contact plug 195 may be formed on the second bit line 600 and may be electrically connected to the second bit line 600.

In this case, the storage contact 1400 of the cell array region and a first metal contact plug 195 of the peripheral region may be simultaneously formed.

Figure 21:
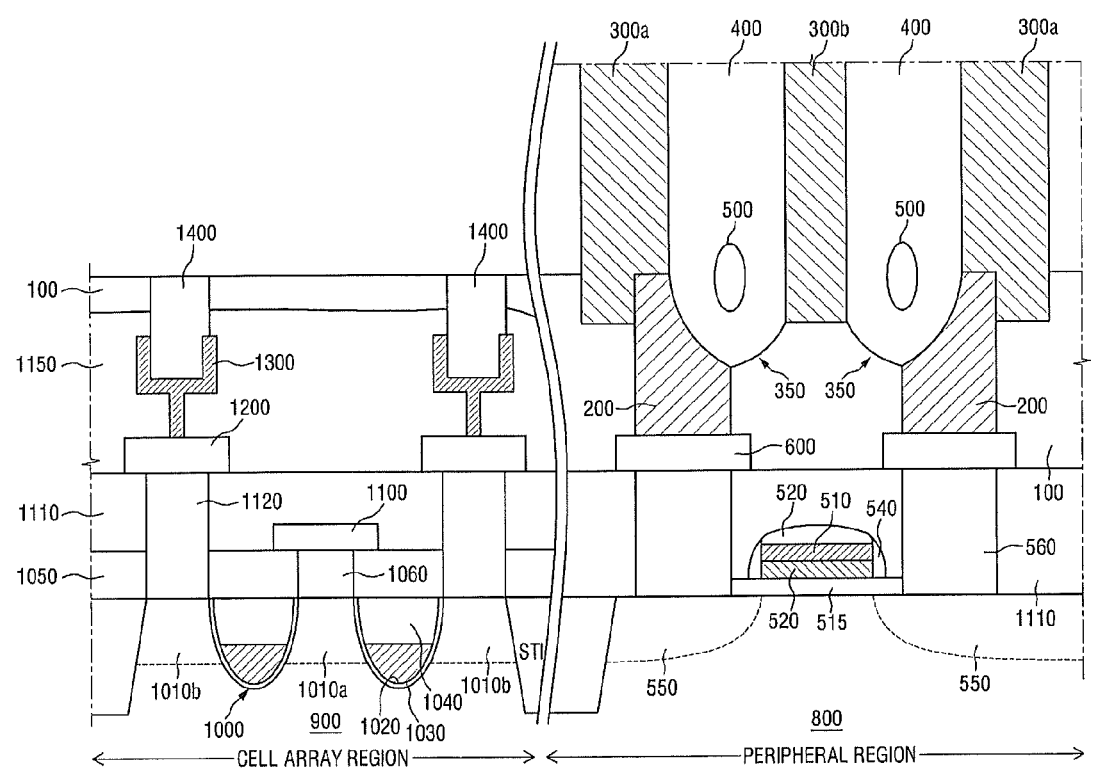

Referring to FIG. 21, in the peripheral region, an etch stop layer 199 and a third interlayer insulating layer 299 may be formed on the first interlayer insulating layer 100 and the first metal contact plug 195. The etch stop layer 199 and the third interlayer insulating layer 299 may be etched until the first metal contact plug 195 is exposed.

Then, on an upper surface of the first metal contact plug 195, a first interlayer wiring 300*a* that overlaps the first metal contact plug 195 may be formed. In this case, a second interlayer wiring 300*b* that does not overlap the first metal contact plug 195 may be formed.

The third interlayer insulating layer 299, the etch stop layer 199, and the first interlayer insulating layer 100 may be etched using the first interlayer wiring 300*a* and the second interlayer wiring 300*b* as masks until the first metal contact plug 195 is exposed. The third interlayer insulating layer 299 and the etch stop layer 199 may be entirely etched. However, only a part thereof may be etched.

The first metal contact plug 195 may be etched to form a first trench 350 using the first interlayer wiring 300*a* and the second interlayer wiring 300*b* as masks. As the first metal contact plug 195 is etched, the first metal contact plug 200, of which the upper portion is etched, may be formed. In this case, the first metal contact plug 195 may be etched using wet etching. At this time, etching solution may be chlorine (Cl).

The first trench 350 may have various shapes. For example, as illustrated, a side wall of the first trench 350 may be tilted at a predetermined angle. Further, a connection portion of a bottom surface and a side wall of the first trench 350 may be in a round shape.

The second interlayer insulating layer 400 may be formed to bury the first trench 350. The second interlayer insulating layer 400 may be fully filled with an insulating material. The second interlayer insulating layer 400 may include, for example, at least one of silicon oxide, silicon nitride, and silicon oxynitride.

An air gap 500 may be formed when the second interlayer insulating layer 400 if formed using a method having inferior step coverage. If the air gap 500 is included, the parasitic capacitance is reduced and thus the reliability of the semiconductor device 4 can be improved.

Figure 22:
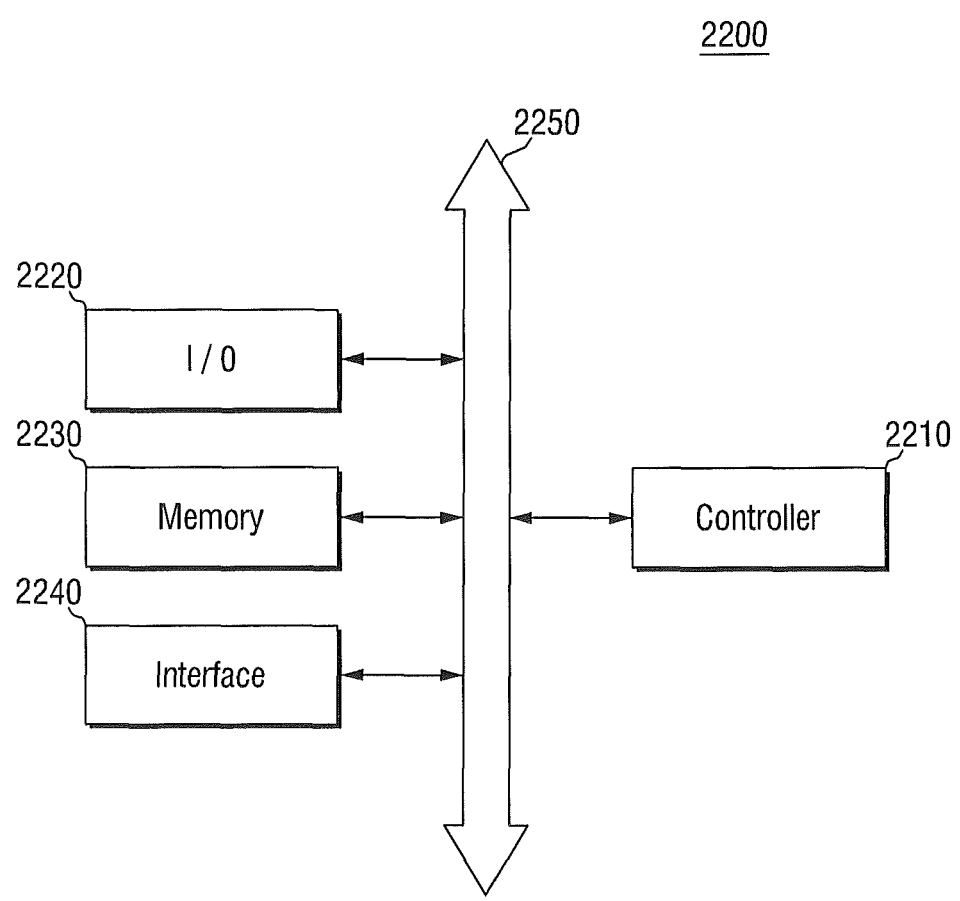
FIG. 22 is an exemplary block diagram of an electronic system including a semiconductor device according to some embodiment of the present invention.

FIG. 22 is an exemplary block diagram of an electronic system including a semiconductor device according to some embodiments of the present invention.

Referring to FIG. 22, an electronic system 2200 according to some embodiments of the present inventive concept may include a controller 2210, an input/output (I/O) device 2220, a memory 2230, an interface 2240, and a bus 2250. The controller 2210, the I/O device 2220, the memory 2230, and/or the interface 2240 may be coupled to one another through the bus 2250. The bus 2250 corresponds to paths through which data is transferred.

The controller 2210 may include at least one of a microprocessor, a digital signal processor, a microcontroller, and logic elements that can perform similar functions. The I/O device 2220 may include a keypad, a keyboard, and a display device. The memory 2230 may store data and/or commands. The memory 2230 may include a semiconductor device according to some embodiments of the present invention. The memory 2230 may include a DRAM.

The interface 2240 may function to transfer the data to a communication network or receive the data from the communication network. The interface 2240 may be of a wired or wireless type. For example, the interface 2240 may include an antenna or a wire/wireless transceiver.

The electronic system 2200 may be applied to a PDA (Personal Digital Assistant), a portable computer, a web tablet, a wireless phone, a mobile phone, a digital music player, a memory card, or all electronic devices that can transmit and/or receive information in wireless environments.

Figure 23:
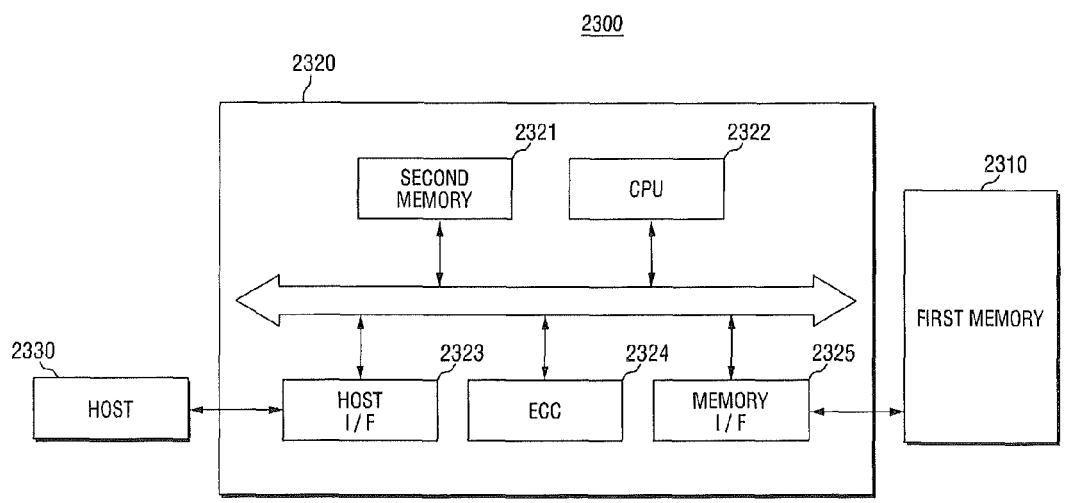
FIG. 23 is a block diagram illustrating an example of a memory card including a semiconductor device that is fabricated according to a method for fabricating a semiconductor device according to embodiments of the present invention.

FIG. 23 is a block diagram illustrating an example of a memory card including a semiconductor device that is fabricated according to a method for fabricating a semiconductor device according to embodiments of the present invention.

Referring to FIG. 23, a first memory 2310 that includes the semiconductor device fabricated according to a method for fabricating a semiconductor device according to various embodiments of the present inventive concept may be adopted in a memory card 2300. The memory card 2300 may include a memory controller 2320 that controls data exchange between a host 2330 and the first memory 2310.

A second memory 2321 may be used as a cache memory of a central processing unit 2322. The second memory 2321 may include a semiconductor device according to some embodiments of the present invention. A host interface 2323 may include a protocol for the host 2330 to connect to the memory card 2300 for the data exchange. An error correction code 2324 may detect and correct errors of the data read from the first memory 2310. A memory interface 2325 may interface with the first memory 2310. The central processing unit 2322 may perform the overall control operation that is related to the data exchange with the memory controller 2320.

Figure 24:
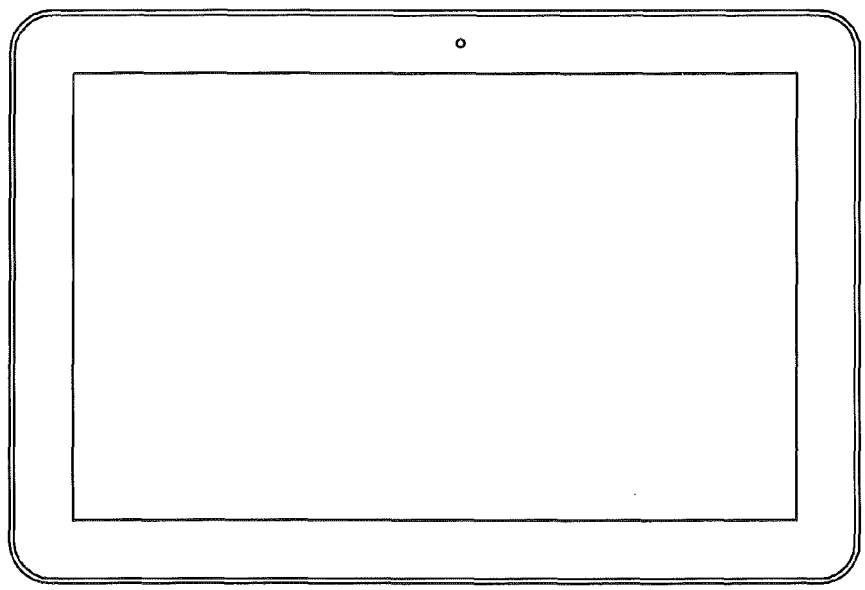
FIGS. 24 and 25 are exemplary views of a semiconductor system to which a semiconductor device according to some embodiments of the present inventive concept can be applied.
Figure 25:
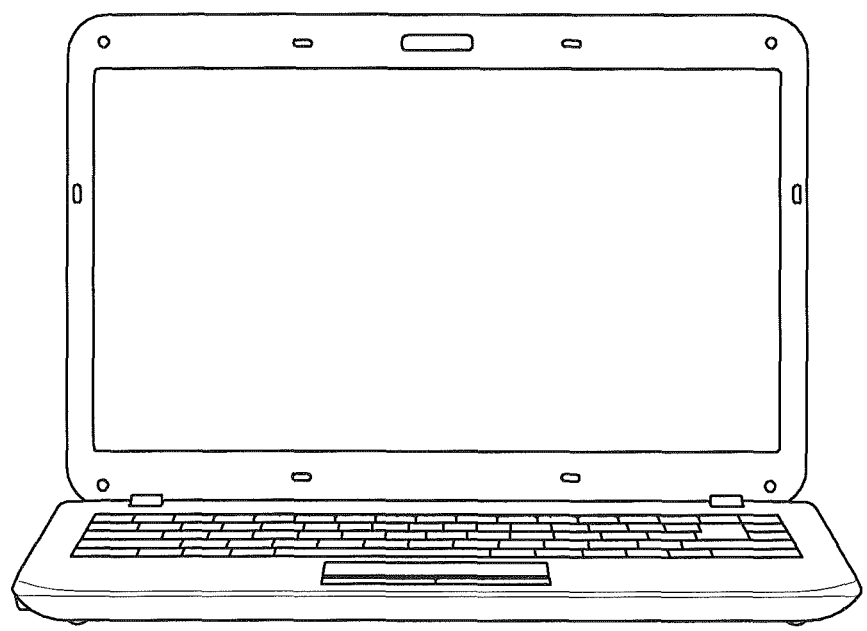

FIGS. 24 and 25 are exemplary views illustrating a semiconductor system to which a semiconductor device according to some embodiments of the present inventive concept can be applied. FIG. 24 illustrates a tablet PC, and FIG. 25 illustrates a notebook PC. It is apparent to those of skilled in the art that the semiconductor device according to some embodiments of the present inventive concept can be applied even to other integrated circuit devices that have not been exemplified.

Although preferred embodiments of the present inventive concept have been described for illustrative purposes, those skilled in the art will appreciate that various modifications, additions and substitutions are possible, without departing from the scope and spirit of the invention as disclosed in the accompanying claims.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A method for fabricating a semiconductor device, comprising:
    providing a first interlayer insulating layer;
    forming a conductive contact plug that penetrates the first interlayer insulating layer;
    forming a second interlayer insulating layer on the first interlayer insulating layer and the conductive contact plug;
    forming a first interlayer wiring that penetrates the second interlayer insulating layer and that overlaps the conductive contact plug;
    etching the second interlayer insulating layer using the first interlayer wiring as an etch mask until the conductive contact plug is exposed; and
    etching an exposed portion of the conductive contact plug using the first interlayer wiring as the etch mask.

2. The method of claim 1, farther comprising forming a third interlayer insulating layer on the first interlayer wiring.

3. The method of claim 2, wherein forming the third interlayer insulating layer comprises forming an air gap in the third interlayer insulating layer.

4. The method of claim 1, further comprising forming an etch stop layer on the first interlayer insulating layer and the conductive contact plug before forming the second interlayer insulating layer.

5. The method of claim 1, wherein the first interlayer wiring comprises copper.

6. The method of claim 1, further comprising forming a second interlayer wiring that penetrates the second interlayer insulating layer and that does not overlap the conductive contact plug,
    wherein the exposed portion of the conductive contact plug is adjacent the second interlayer wiring so that etching the exposed portion of the conductive contact plug recesses the conductive contact plug away from the second interlayer wiring.

7. The method of claim 1, wherein forming the first interlayer wiring comprises forming the first interlayer wiring so that the first interlayer wiring is formed on a side surface of the conductive contact plug.

8. The method of claim 7, wherein etching the exposed portion of the conductive contact plug comprises etching opposing sides of the conductive contact plug.

9. The method of claim 1, wherein the etching the exposed portion of the conductive contact plug comprises etching the conductive contact plug using wet etching.

10. The method of claim 9, wherein the wet etching is performed using chlorine (Cl).

11. The method of claim 1, wherein the conductive contact plug comprises a first material and the first interlayer wiring comprises a second material that has an etch selectivity relative to the first material.

12. The method of claim 11, wherein the first material comprises polysilicon, a metal silicide compound, and/or a conductive metal nitride, and wherein the second material comprises copper.

13. The method of claim 1, wherein etching the exposed portion of the conductive contact plug comprises isotropically etching the conductive contact plug.

14. A method of fabricating a semiconductor device, comprising:
    providing a substrate in which a cell array region and a peripheral region are defined;
    forming a memory device in the cell array region; and
    forming an interlayer wiring in the peripheral region,
    wherein forming the interlayer wiring comprises:
        forming a copper wiring on a conductive contact plug, wherein the copper wiring overlaps the conductive contact plug; and
        etching a portion of the conductive contact plug using the copper wiring as a mask.

15. The method of claim 14, further comprising:
    forming a landing pad that is electrically connected to a capacitor in the cell array region; and
    forming a bit line that is electrically connected to the conductive contact plug, in the peripheral region,
    wherein the landing pad and the bit line are formed simultaneously.

16. The method of claim 14, further comprising forming a capacitor contact that is electrically connected to a capacitor in the cell array region,
    wherein the conductive contact plug and the capacitor contact are formed simultaneously.

17. The method of claim 14, wherein etching the exposed portion of the conductive contact plug comprises etching the exposed portion of the conductive contact plug using wet etching.

18. The method of claim 17, wherein the wet etching is performed using chlorine (Cl).

19. A method of forming an interlayer wiring structure in a semiconductor device, the method comprising:
    forming a conductive contact plug:
    forming an interlayer wiring on the conductive contact plug, wherein the interlayer wiring overlaps the conductive contact plug;
    etching an exposed portion of the conductive contact plug using the interlayer wiring as an etch mask.

20. The method of claim 19, farther comprising forming a second interlayer wiring that does not overlap the conductive contact plug, wherein the exposed portion of the conductive contact plug is adjacent the second interlayer wiring so that etching the exposed portion of the conductive contact plug recesses the conductive contact plug away from the second interlayer wiring.

* * * * *